(12) United States Patent
Burroughs et al.

(10) Patent No.: US 6,420,692 B1
(45) Date of Patent: Jul. 16, 2002

(54) ZIG-ZAG-PATTERNED POSITION SENSOR SYSTEM

(75) Inventors: Alan C. Burroughs; Brian P. Tremaine, both of San Jose, CA (US)

(73) Assignee: Terastor Corporation, San Jose, CA (US)

(*) Notice: Subject to any disclaimer, the term of this patent is extended or adjusted under 35 U.S.C. 154(b) by 0 days.

(21) Appl. No.: 09/440,312

(22) Filed: Nov. 12, 1999

(51) Int. Cl.$^7$ ............................................... H01L 31/00
(52) U.S. Cl. ........................... 250/214.1; 250/214 R; 250/559.29
(58) Field of Search .................. 250/214 R, 214.1, 250/201.5, 559.29

(56) References Cited

U.S. PATENT DOCUMENTS 6,130,744 A * 10/2000 Abe et al. ................... 369/53

FOREIGN PATENT DOCUMENTS

JP          403108688 A  *  5/1991

* cited by examiner

*Primary Examiner*—Stephone Allen
(74) *Attorney, Agent, or Firm*—Fish & Richardson P.C.

(57) ABSTRACT

An optical position detector which has adjacent detector cells connected to each other in a zig-zag pattern offers a wider dynamic range than a detector with a vertical separation line during transition between a read laser power and a write laser power. This allows use of a fast response bi-cell in place of a slower position sensing device (PSD). The optical position detector has detector cells coupled to each other in a zig-zag pattern. Each detector cell produces a signal when a light beam is focused onto the cell to indicate a location of the light beam relative to the cell.

19 Claims, 7 Drawing Sheets

ZIG-ZAG-PATTERNED POSITION SENSOR SYSTEM

BACKGROUND

The present disclosure relates to determination of a position of an optical spot relative to an optical system.

Optical systems often use position sensing detectors (PSDs) to determine the position of an optical spot that is incident upon the active surface of a device. The optical spot may be a reflected laser beam from the surface of an optical recording medium. The PSD device is constructed using photodetectors, such as photo-diodes or PIN-diodes, in a bi-cell, quadrant or lateral configuration. Signals required for the X and Y displacement of the spot is found by suitably subtracting currents from adjacent cells, followed by normalization to the total intensity of the optical spot. However, with rapid increase in the optical processor speed, the need for faster and more accurate position detectors is desirable.

The PSD device has relatively low output impedance, which often causes offsets when fed to current sensing pre-amplifiers. This may lead to power adjustment problems in a laser beam source during a transition between read and write operations of the optical system. A read operation of an optical system often involves a reflected laser beam modulated with both tracking information and the data stored on the optical recording medium. A write operation involves modulating the laser beam via an optical modulation including beam intensity, phase, and polarization at a laser beam source. Therefore, the transition between these two operations may cause considerable delay in the efficient operation of the optical system.

SUMMARY

An enhanced optical position detector having detector cells is disclosed. The detector cells are connected to each other in a jagged or curved line where segments of the jagged or curved line are interleaved in a saw-tooth shape. The line segments are symmetric about a line drawn through middle of the segments. Each detector cell produces a signal proportional to an amount of light incident on each cell. The signal indicates a location of the optical spot relative to the detector. The saw-tooth shape of the jagged or curved separation line allows the detector to be relatively insensitive to a displacement of the optical spot along a direction of the jagged or curved line.

In another aspect, a differencing element which operates to difference the signals from adjacent detector cells to produce a differencing signal is disclosed. The differencing signal indicates the position of the optical spot.

Other features and advantages will become apparent from the following description and drawings, and from the claims.

DETAILED DESCRIPTION

Figure 1A:
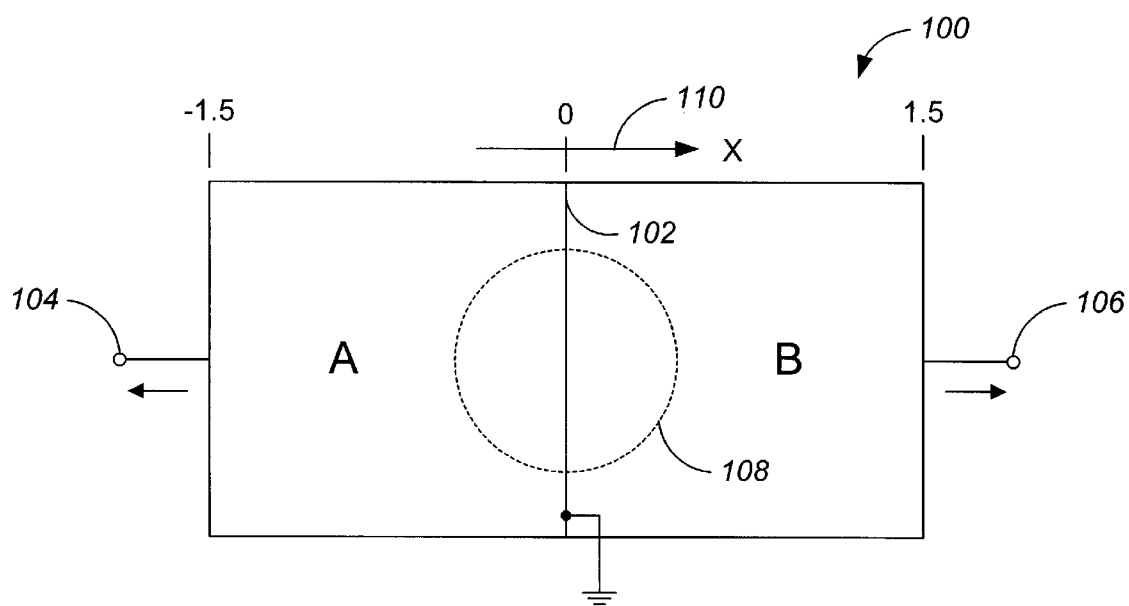
FIG. 1A is a conventional optical detector.

A conventional optical detector 100, shown in FIG. 1A, includes two photodetector cells A and B that are manufactured from a single piece of doped semiconductor material, and are placed adjacent to each other. A grounded vertical line 102 separates the two cells. Two electrical leads 104, 106, one from each cell, carry photocurrent from the cells A and B, respectively.

When a beam of light 108 hits the detector 100 and scans the detector 100 horizontally, each cell produces a signal that depends on the location of the beam 108 within the detector 100. The amplitude of the signal coming from each cell is determined by the coverage of the beam 108 incident upon each cell, and hence the amplitude from a cell is higher when more of the beam 108 is illuminating that cell. Therefore, the position of the beam 120 relative to the vertical line 102 is often determined by differencing the signals coming from the two adjacent cells. The result is a subtracting signal, A–B or B–A.

In one embodiment, the dimensions of the detector 100 is 3 mm in width and 1 mm in length. The vertical separation line 102 indicates the reference point of the x-axis.

Figure 1B:
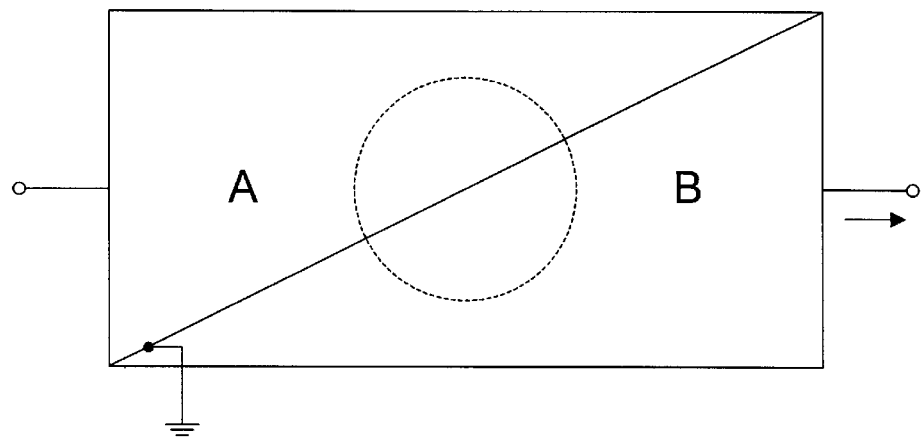
FIG. 1B is a conventional optical detector with a diagonal separation line.

The optical detector 100 is insensitive to vertical displacement of the beam 108 because the separation line 102 between the two cells A and B are vertical, and hence, has no effect on the subtracting signal. However, a slightly varied optical detector, shown in FIG. 1B, with a diagonal separation line between the cells, is sensitive to any vertical displacement.

Figure 2A:
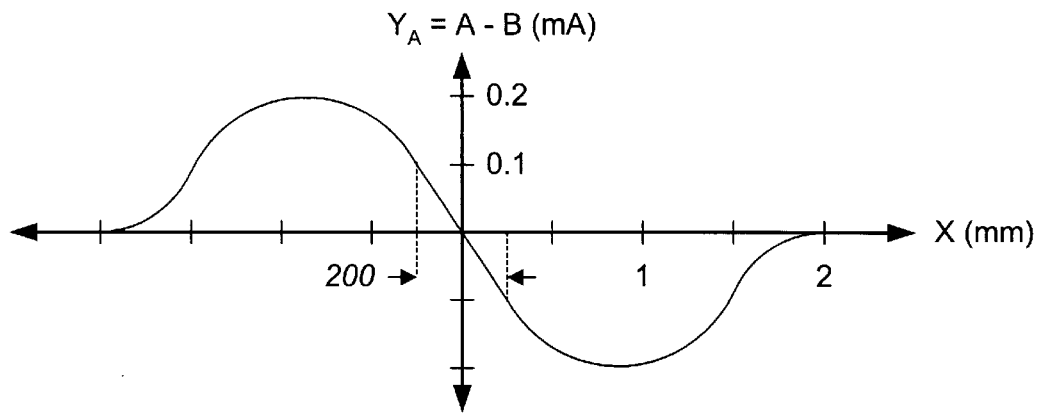
FIG. 2A shows a plot of the subtracting signal of the cells in the conventional optical detector.

A plot of the subtracting signal is shown in FIG. 2A. The figure shows the difference of the amplitudes of signals A and B versus position relative to the separation line 102 as the beam of light 108 moves across the optical detector 100 in the X direction 110. The amplitudes of the subtracting signal range between −0.2 mA and +0.2 mA.

The dynamic range of the optical detector 100, which is the range of positions of the beam 108 within which accurate measurements can be made, falls within the linear range of the subtracting signal. The plot of the subtracting signal shows the dynamic range 200 to be approximately 0.5 mm for beam width of 0.8 mm.

Figure 2B:
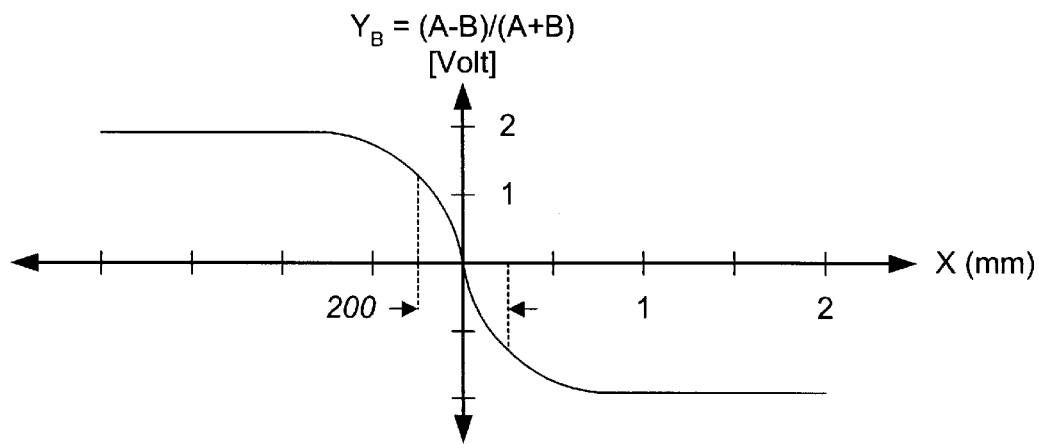
FIG. 2B shows a plot of the subtracting signal normalized to the summing signal.

FIG. 2B shows a plot of the output signal normalized to the summing signal which represents the total electrical intensity produced by the beam 108 falling on the cells A and B. An advantage of monitoring the normalized signal versus the subtracting signal is the fact that the normalized signal is less sensitive to the strength of the beam 108 and the sensitivity of the detector 100.

The normalized plot shows the dynamic range 200 of the optical detector 100 between approximately −0.25 mm and +0.25 mm. The amplitude of the normalized signal in the dynamic range 200 is about 2.4 volts, which results in a slope of 4.8 volts/mm.

Figure 2C:
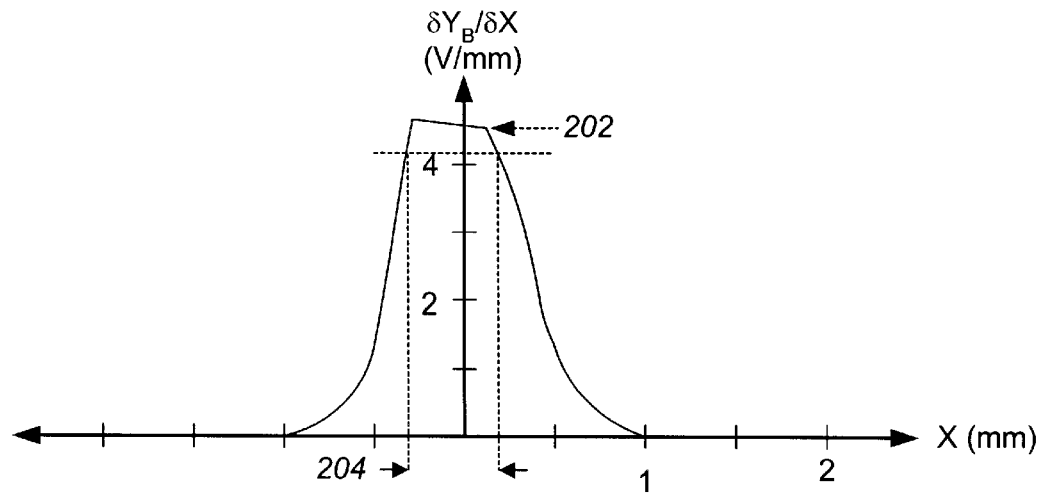

The gain of the optical detector 100 which is represented by the slope of the normalized signal, shown in FIG. 2B, is plotted in FIG. 2C. The nominal gain 202 is shown to be about 4.8 volts/mm and the range 204 over which the gain is within 10% of the nominal gain 202 is only about 0.5 mm.

Figure 3:
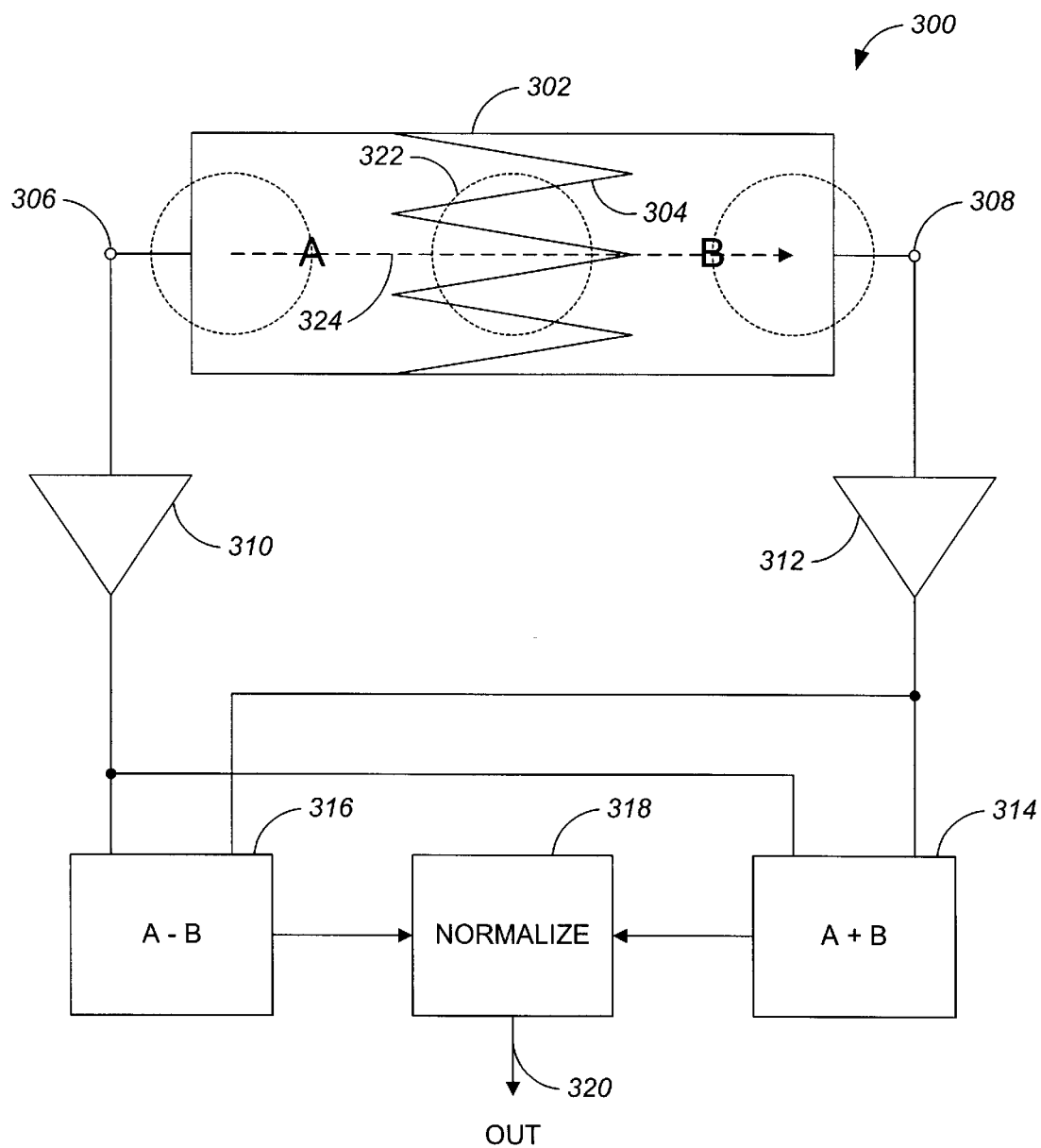
FIG. 3 is a zig-zag-patterned optical detector system.

A zig-zag-patterned optical detector system 300 (FIG.3) includes a position detector 302, such as a PIN-diode position sensor. The detector 302, formed as an integrated circuit on a single piece of semiconductor material, has two cells A and B connected in a zig-zag pattern 304. Two electrical leads 306, 308, one from each cell, carry photo-current from the cells A and B, respectively. As beam of light 322 hits the detector 302 and scans the detector 302 from left to right 324, each cell produces a signal that depends on the location of the beam 322. Each of the detector cells A and B has a curved or jagged boundary line that is conforming to a boundary line of an adjacent cell. The boundary line curved or jagged is in such a pattern that a straight line drawn in the middle of the boundary line along the direction of the boundary line touches each cell in at least two points. Each detector cell produces a signal that is proportional to an amount of light incident on said each cell and indicates a location of the optical spot of the beam 322 relative to the detector.

The op-amps 310, 312 amplify the photocurrents generated by the photodetector cells A and B and supply the amplified signal to the subtracting circuit 316 and the summing circuit 314 for generating the normalized output signal 320, (A−B)/(A+B). This output signal 320 is linearly related to the position of the beam 322 on the photodetector cells A and B.

Figure 4A:
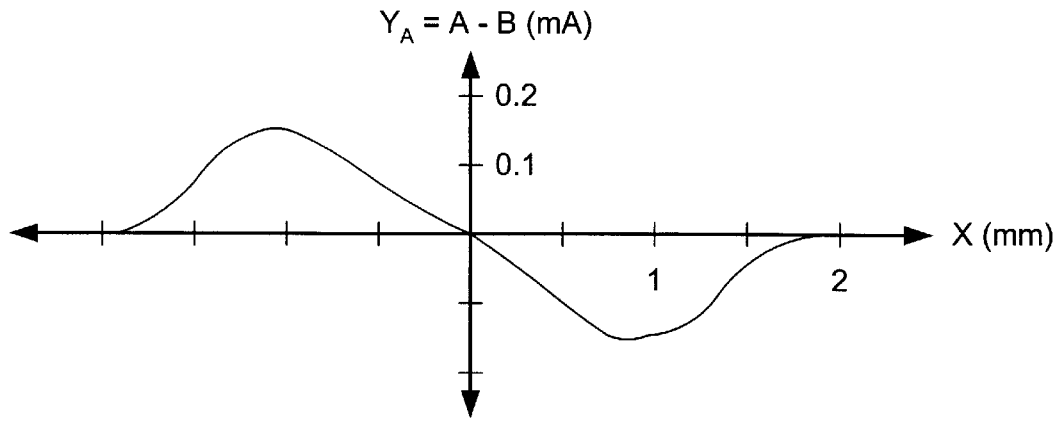
FIGS. 4A and 4B show plots of the subtracting and the normalized signals for the zig-zag-patterned optical detector system.
Figure 4B:
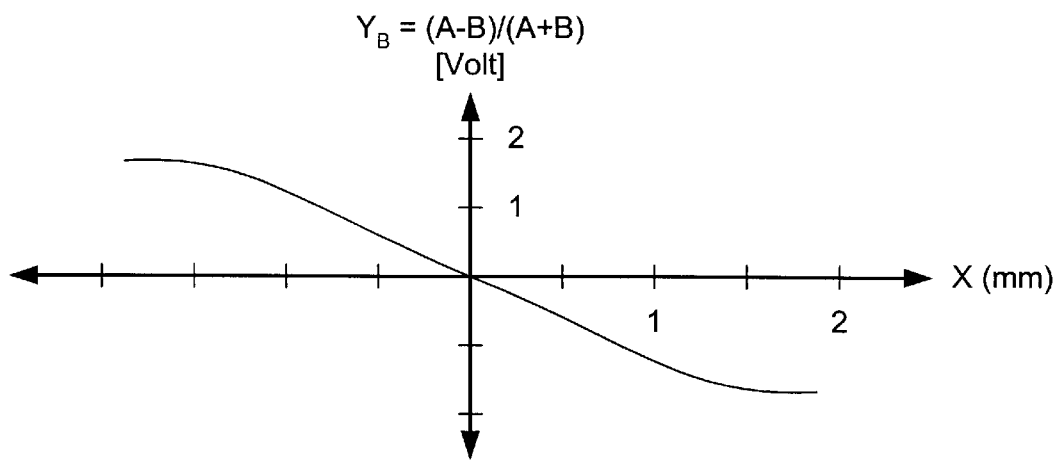

FIGS. 4A and 4B show plots of the subtracting and normalized signals for the zig-zag-patterned optical detector system 300. The plots show the response of the detector 302 as the beam of light 322, having beam width of 0.8 mm, horizontally scans the detector 302. The plots are similar in shape to the respective signals for the conventional detector 100. However, the enhanced system 300 with zig-zag-patterned optical detector 302 shows output signals having lower amplitudes and significantly longer linear regions, which results in wider dynamic range and higher responsitivity. The plots show the dynamic range of the zig-zag-patterned optical detector 302 to be approximately 2.0 mm.

Figure 4C:
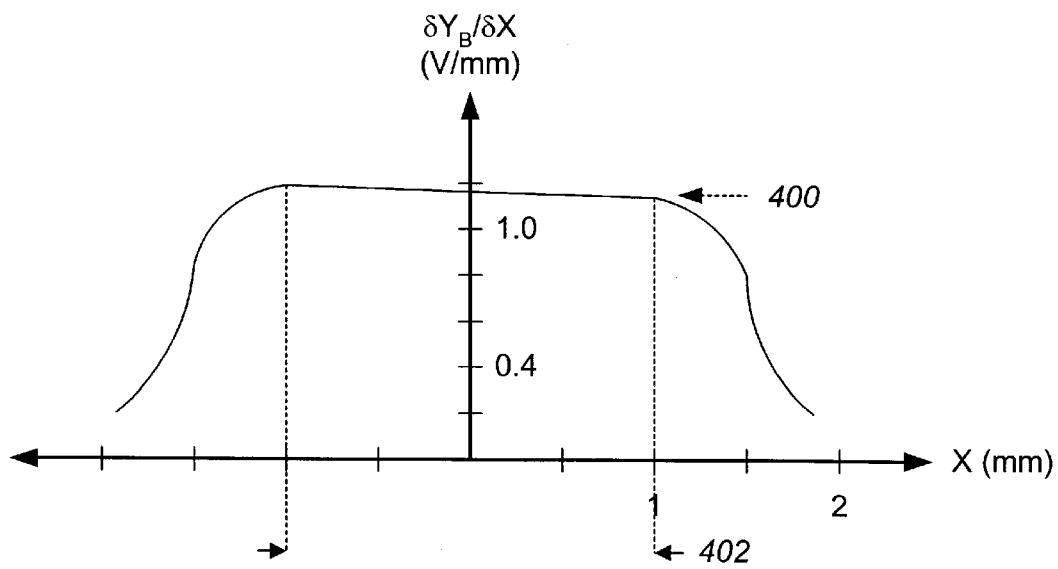
FIG. 4C shows a plot of the gain of the zig-zag-patterned system.

The gain of the enhanced system 300 is plotted in FIG. 4C. The nominal gain 400 is shown to be approximately 1.17 volts/mm and the dynamic range 402 over which the gain is within 10% of the nominal gain 400 is increased four-fold over the conventional detector 100 to about 2.0 mm.

Figure 5A:
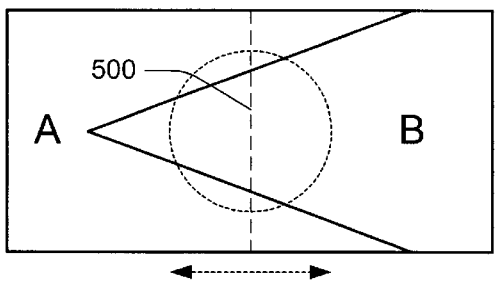
FIGS. 5A through 5C are several different embodiments of the zig-zag-patterned optical detector.
Figure 5C:
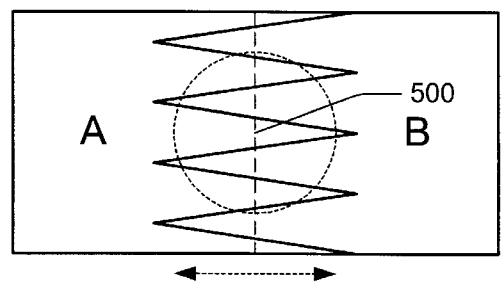
Figure 5B:
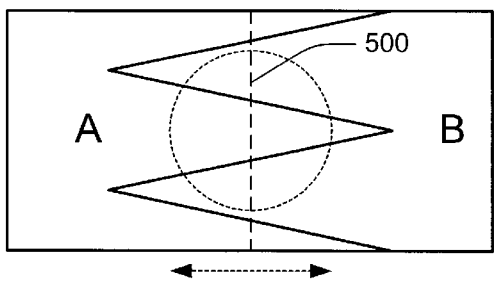

Several different embodiments of the zig-zag-patterned optical detector 302 are shown in FIGS. 5A through 5C. Each detector 302 has two cells, A and B, which are coupled in a saw-tooth shape with a varying number of teeth. The number of teeth or the length of the zig-zag pattern, along with the beam width, determines the dynamic range of the optical detectors. Therefore, the dynamic range of the zig-zag-patterned detector 302 can be further increased over that of the conventional detector 100 by increasing the number of teeth in the detector pattern. For example, in FIGS. 4A and 4B, the curves will get flatter and the regions where the curves are linear will get wider as the length of zig-zag pattern increases. This will also be reflected in the gain curve of FIG. 4C with wider dynamic range 402.

Figure 5D:
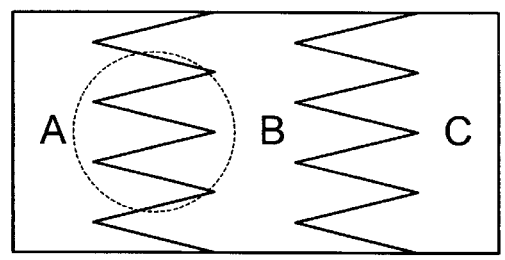
FIG. 5D is a three-cell detector system.

FIG. 5D shows a three-cell configuration, with cells A, B and C, in which the cells are connected in zig-zag patterns. This configuration is used to detect the position of a light beam over a wider range.

Figure 6A:
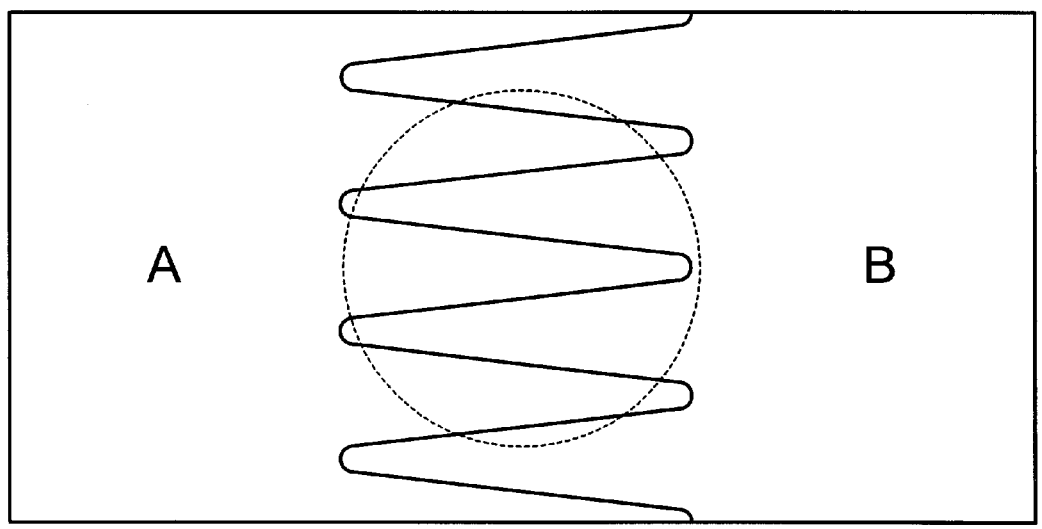
FIGS. 6A and 6B are further embodiments of the zig-zag-patterned optical detector.
Figure 6B:
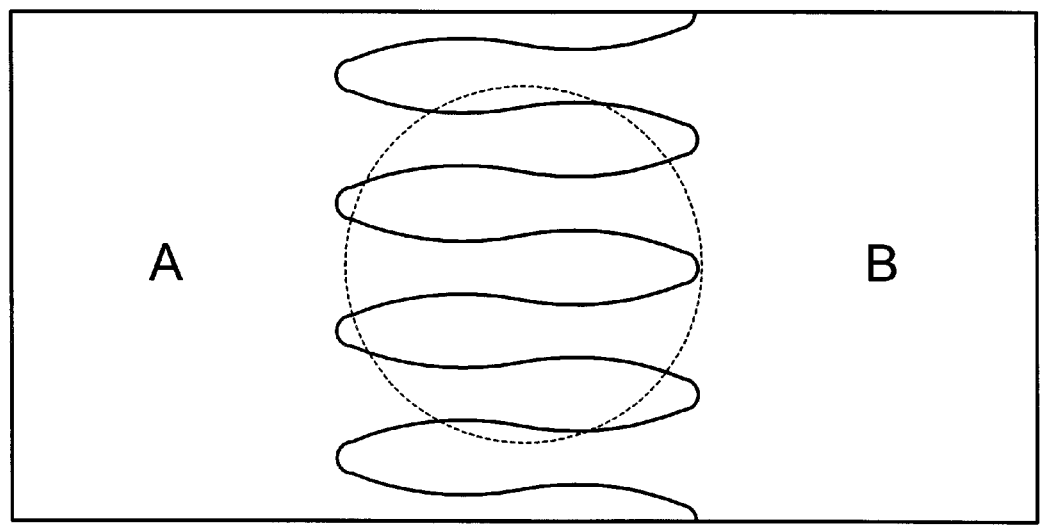

Further embodiments of the zig-zag-patterned detector 302 are shown in FIGS. 6A and 6B. FIG. 6A shows a saw-tooth pattern with rounded tips, while FIG. 6B shows another pattern in the shape of inter-leaved fingers. Both patterns will increase the size of the linear region as long as the patterns are symmetric about the center vertical line.

Figure 7:
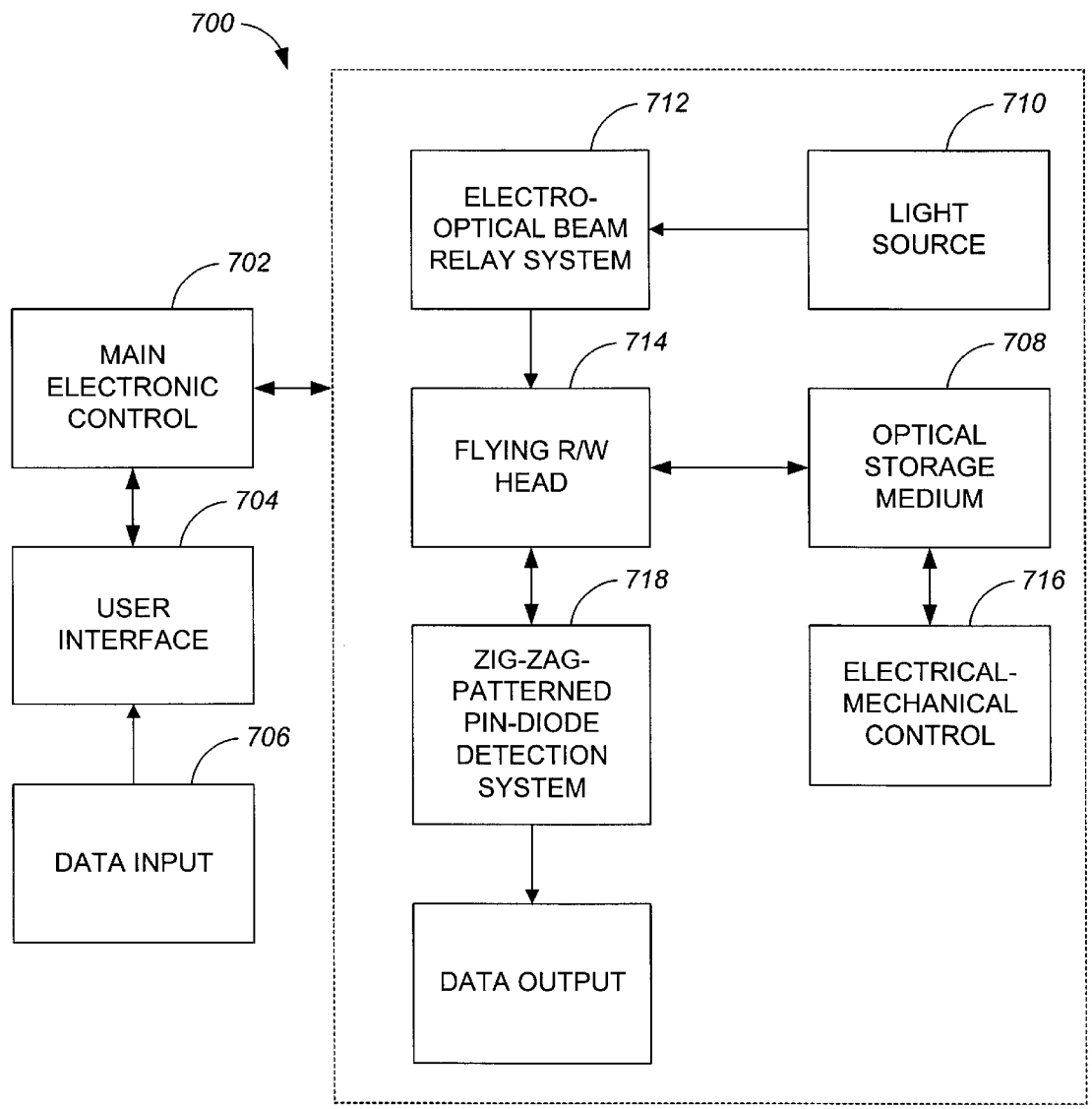
FIG. 7 is a block diagram of a magneto-optic storage system.

FIG. 7 is a block diagram of an optical storage system 700 which includes a zig-zag-patterned position sensor 718. The system 700 provides an user interface 704 of data input 706 through main electronic control 702 which is preferably implemented to monitor and control all components and subsystems. The user interface 704 includes, but is not limited to, a computer keyboard, a display, electrical and mechanical switches and control buttons. The system 700 also includes an optical storage medium 708 in the form of a disk or other format. In some embodiments, the disk is a magneto-optic disk, a write-once disk, a phase-change disk, or a read-only disk.

In one embodiment, a flying read/write head 714 and the optical medium 708 are positioned relative to each other so that the optical spacing therebetween is less than one wavelength of the light produced by the light source 710. This is known as the near-field configuration. An air-bearing surface is preferably implemented at the base of the flying head 714 to maintain a desired focus without conventional servo optics for focusing. Alternatively, a non-near-field configuration can also be used with the flying head 714, in which case the separation between the flying head and the recording layer does not allow efficient coupling of evanescent waves and thus a conventional servo focusing system is needed to directly focus the beam onto the recording surface.

In a readout operation, a reflected laser beam usually is modulated with both tracking information and the data stored on the optical medium 708. In a recording operation, the reflected laser beam from the optical medium 708 is encoded with beam-tracking information. Recording data onto the optical medium 708 can be done by either modulating a writing beam via an optical modulation including beam intensity, phase, and polarization either at the light source 710 or at the beam relay system 712, or directly modulating the state of the optical medium 708 through thermal or electromagnetic methods. Thus, a transition from the readout operation to the recording operation can cause delays in the system.

One of the advantages of the zig-zag-patterned position sensor 718 is that it provides a more linear transfer function and wider dynamic range than the conventional PSDs. As a result, a laser beam source 710 in the optical storage system 700 recovers more quickly when switching between the recording and the readout operation.

Although only a few embodiments have been described in detail above, those of ordinary skill in the art certainly understand that modifications are possible. For example, the two photodetector cells A and B can be connected with patterns other than the zig-zag pattern, such as a figure-eight pattern. Further, the photodetector cells with zig-zag pattern can be extended to have more than two or three cells, such as a quadrant configuration. All such modifications are intended to be encompassed within the following claims, in which:

What is claimed is:

1. An optical position detector comprising:

adjacent detector cells electrically coupled to each other in a zig-zag pattern to have a common boundary that provides an electrical ground to both of said adjacent detector cells, each detector cell having an output electrical lead separate from said electrical ground to output a signal when a light beam is focused onto said each cell to indicate a location of said light beam relative to said optical position detector.

2. The detector of claim 1, wherein said detector cells are formed from a single piece of doped semiconductor material and the signal produced by said each detector cell is indicative of an amount of light beam falling on said each detector cell.

3. An optical position detector to detect an optical spot comprising:

detector cells, each cell having a curved or jagged boundary line that is conforming to a boundary line of an adjacent cell, said boundary line curved or jagged in such a pattern that a straight line drawn in the middle of the boundary line along the direction of the boundary line touches said each cell in at least two points, each detector cell responsive to light to produce a current signal proportional to an amount of light incident on said each cell, said current signal indicating a location of the optical spot relative to the detector;

signal amplifiers respectively coupled to said detector cells to amplify said current signals;

a differencing element operating to difference said current signals from adjacent detector cells to produce a differencing signal indicating the position of the light beam; and a normalizing element coupled to receive said differencing signal and operable to produce a normalized signal that is less sensitive to strength of the light beam and characteristics of the detector cells compared to said differencing signal.

4. An optical detector system for determining a position of a light beam incident on an optical detector, the system comprising:

adjacent detector cells formed from a single piece of doped semiconductor material and electrically connected to each other in a common electrically grounded boundary which forms a jagged or curved line where segments of the jagged or curved line are interleaved in a saw-tooth shape, each detector cell producing a signal proportional to an amount of light beam incident on said each cell, such that the saw-tooth shape allows the detector to be relatively insensitive to a displacement of the light beam along a direction of the jagged or curved line; and a differencing element operating to difference said signals from adjacent detector cells to produce a differencing signal indicating the position of the light beam.

5. The system of claim 4, further comprising:

amplifiers adapted to receive said signals from the detector cells and producing amplified signals for said differencing element.

6. The system of claim 4, wherein there are two detector cells connected to each other in a saw-tooth shape.

7. An optical detector system for determining a position of a light beam incident on an optical detector, comprising:

detector cells connected to each other in a jagged or curved line where segments of the jagged or curved line are interleaved in a saw-tooth shape, each detector cell producing a signal proportional to an amount of light beam incident on said each cell, such that the saw-tooth shape allows the detector to be relatively insensitive to a displacement of the light beam along a direction of the jagged or curved line;

a differencing element operating to difference said signals from adjacent detector cells to produce a differencing signal indicating the position of the light beam; and a normalizing element operating on said differencing signal to produce a normalized signal, where the normalized signal is less sensitive to strength of the light beam and characteristics of the detector cells.

8. The system of claim 7, wherein said normalizing element normalizes the differencing signal to a total intensity of the light beam incident on said optical detector.

9. An optical detector system for determining a position of a light beam incident on an optical detector, comprising:

detector cells connected to each other in a jagged or curved line where segments of the jagged or curved line are interleaved in a saw-tooth shape, each detector cell producing a signal proportional to an amount of light beam incident on said each cell, such that the saw-tooth shape allows the detector to be relatively insensitive to a displacement of the light beam along a direction of the jagged or curved line; and a differencing element operating to difference said signals from adjacent detector cells to produce a differencing signal indicating the position of the light beam, wherein said detector cells are manufactured from a single piece of doped semiconductor material.

10. An optical storage system having an optical medium, the system comprising:

a light source producing a light beam at a wavelength to which the optical medium is responsive;

a flying head disposed to shape and focus the light beam onto the optical medium to read and write data thereon, said flying head also disposed to receive and route a reflected beam from the optical medium; and an optical detector having detector cells connected to each other in a jagged or curved line where segments of the jagged or curved line are interleaved in a saw-tooth shape, each detector cell producing a signal proportional to an amount of light incident on said each cell, said signal indicating a location of the reflected beam relative to the detector, such that the saw-tooth shape allows the detector to be relatively insensitive to a displacement of the reflected beam along a direction of the jagged or curved line.

11. The system of claim 10, wherein the flying head and the optical medium are positioned relative to each other so that the optical spacing therebetween is less than one wavelength of the light beam produced by the light source, such that an air-bearing surface is implemented at a base of the flying head to maintain a desired focus without conventional servo optics for focusing.

12. The system of claim 10, wherein said optical medium is a magneto-optic disk.

13. The system of claim 10, wherein said optical medium is a write once disk.

14. The system of claim 10, wherein said optical medium is a phase-change disk.

15. The system of claim 10, wherein said optical medium is a read-only disk.

16. The system of claim 10, further comprising:

a main electronic control to monitor and control operation and interface of the optical medium, the light source, the flying head, and the optical detector; and an user interface coupled to the main electronic control, said user interface initiating data input to the main electronic control.

17. An optical storage system having an optical medium, the system comprising:

a light source producing a light beam at a wavelength to which the optical medium is responsive;

a flying head disposed to shape and focus the light beam onto the optical medium to read and write data thereon, said flying head also disposed to receive and route a reflected beam from the optical medium;

detector cells connected to each other in a jagged or curved line where segments of the jagged or curved line are interleaved in a saw-tooth shape, each detector cell producing a signal proportional to an amount of light incident on said each cell, such that the saw-tooth shape allows the detector to be relatively insensitive to a displacement of the reflected beam along a direction of the jagged or curved line; and a differencing element operating to difference said signals from adjacent detector cells to produce a differencing signal indicating the position of the light beam.

18. The system as in claim 17, further comprising a normalizing element coupled to receive said differencing signal and operable to produce a normalized signal that is less sensitive to strength of the light beam and characteristics of the detector cells compared to said differencing signal.

19. A method for operating an optical disk drive for reading data from an optical storage disk and writing data to the optical storage disk, comprising:

using an optical head to couple an input optical beam to the optical storage disk;

using the same optical head to direct reflected light from the optical storage disk to an optical detector which has at least two adjacent detector cells formed from a single piece of doped semiconductor material, the detector cells connected to each other in a common electrically grounded boundary which forms a jagged or curved line where segments of the jagged or curved line are interleaved in a saw-tooth shape;

differentiating two separate signals respectively produced by the two adjacent detector cells to produce a differential signal to represent a position of reflected light on the optical detector; and using the differential signal to monitor writing operations, reading operations, and switching between reading and writing operations of the optical disk drive.

* * * * *